United States Patent
Adler et al.

(10) Patent No.: US 6,703,844 B2
(45) Date of Patent: Mar. 9, 2004

(54) METHOD FOR DETERMINING THE TRANSIT TIME OF ELECTRICAL SIGNALS ON PRINTED CIRCUIT BOARDS USING AUTOMATIC STANDARD TEST EQUIPMENT

(75) Inventors: Frank Adler, München (DE); Thomas Huber, München (DE); Manfred Moser, Dachau (DE); Martin Versen, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/223,899

(22) Filed: Aug. 20, 2002

(65) Prior Publication Data

US 2003/0034784 A1 Feb. 20, 2003

(30) Foreign Application Priority Data

Aug. 20, 2001 (DE) .......................... 101 40 757

(51) Int. Cl.$^7$ .......................... G01R 31/28; G04F 8/00
(52) U.S. Cl. .................. 324/637; 324/765; 324/158.1; 324/73.1; 368/113; 368/118
(58) Field of Search .................. 324/637, 642, 324/532, 527, 535, 765, 158.1, 73.1, 761; 368/113, 118; 714/700, 712; 333/17.1

(56) References Cited

U.S. PATENT DOCUMENTS 6,184,708 B1 * 2/2001 Jenkins, IV .................. 326/39
6,191,601 B1   2/2001 Swart .......................... 324/261
6,369,601 B1 * 4/2002 Ishigaki ....................... 324/765
6,530,062 B1 * 3/2003 Liaw et al. ..................... 716/2

OTHER PUBLICATIONS

User Guide: "Printed Circuit Board (PCB) Test Methodology", Intel, Revision 1.6, Jan. 2000, pp. 8–15.

* cited by examiner

Primary Examiner—N. Le
Assistant Examiner—Vincent Q. Nguyen
(74) Attorney, Agent, or Firm—Laurence A. Greenberg; Werner H. Stemer; Ralph E. Locher

(57) ABSTRACT

Signal transit times on printed circuit boards which are equipped with all the passive components but without any active components can be determined using automatic standard test equipment composed of a standard test unit and a performance board with fittings attached thereto. In that first, using a standard routine of the test unit, a transit time is measured on the performance board from the CIF connector as far as the fitting, then a printed circuit board is plugged into the fitting location determined for it and then the sum transit time of the CIF connector is measured as far as the landing pad on the printed circuit board. By forming differences between the two measured values, the transit times on a printed circuit board can be measured with a high degree of precision with the automatic standard test equipment used in standard module testing technology.

5 Claims, 2 Drawing Sheets

METHOD FOR DETERMINING THE TRANSIT TIME OF ELECTRICAL SIGNALS ON PRINTED CIRCUIT BOARDS USING AUTOMATIC STANDARD TEST EQUIPMENT

BACKGROUND OF THE INVENTION

Field of the Invention

The invention relates to a method for determining the transit time of electrical signals on printed circuit boards, in particular printed circuit boards which can be equipped with memory chips such as SDRAMs, using time domain reflection measurement (TDR measurement) and automatic standard test equipment.

The usually unknown transit times of electrical signals on printed circuit boards or PCBs have hitherto been simulated in computers. After the mounting of the circuit board, the transit times can be determined experimentally using time domain reflection measurement by a unit that is specially produced for this purpose.

In automatic standard test equipment (ATE), the time domain reflection measurements are typically used in order to determine transit times on the performance board associated with the ATE, which transit times are then taken into account as offset parameters. When the transit times are standardized during production, it is conventional practice not to determine or take into account transit times on the printed circuit boards PCB of, for example, SDRAM modules.

SUMMARY OF THE INVENTION

It is accordingly an object of the invention to provide a method for determining the transit time of electrical signals on printed circuit boards using automatic standard test equipment which overcomes the above-mentioned disadvantages of the prior art devices and methods of this general type, in which usually unknown transit times of electrical signals on printed circuit boards (PCBs) are determined per channel using automatic standard test equipment in order to optimize test parameters and increase the precision of tests to be carried out.

With the foregoing and other objects in view there is provided, in accordance with the invention, a method for determining transit times of electrical signals on printed circuit boards using a time domain reflection measurement technique. The method includes measuring a first signal transit time of a first signal travelling from a starting point to a fitting of a specific plug-in slot on a standard performance board of an automatic test equipment unit. The standard performance board is configured without a printed circuit board being plugged in the fitting. The printed circuit board is then inserted into the fitting of the plug-in slot of the standard performance board. A second signal transit time of a second signal travelling from the starting point to an end point along at least one channel on the printed circuit board plugged in, is measured. A difference between the first signal transit time and the second signal transit time is derived, and from the difference, a channel signal transit time of the channel on the printed circuit board is determined.

Using automatic standard test equipment (ATE) and the standard routines made available in it for determining transit times on the performance board associated with the ATE, it is possible, with the method according to the invention, to determine the transit times on the printed circuit board per channel. By using productively employed equipment, all the fault sources that occur during a transfer from an additional piece of test equipment are eliminated.

The transit time measurement is preferably carried out with a partially equipped printed circuit board, that is to say with the entire module without active components such as SDRAMs, PLL or registers, but with all the passive components such as resistors and capacitors.

The transit time measurement of the printed circuit board is preferably carried out for all the channels, that is to say all the signal pins of the printed circuit board. By the formation of a difference between the measured (first) transit time and the measured sum of the transit times (the second transit time), the influence of the printed circuit board becomes clearly apparent.

The invention thus makes it possible for the performance of the fully operationally capable printed circuit board which is equipped with all the components, that is to say of the entire module, to be separated quickly and unambiguously from the influence of the transit time of the printed circuit board. As a result, the test parameters can be optimized and the precision of the tests increased.

The advantage of the present method for determining the transit time is the precise determination of the transit times for each channel on a printed circuit board using automatic standard test equipment ATE and standard performance boards which are used in standard module testing technology.

Other features which are considered as characteristic for the invention are set forth in the appended claims.

Although the invention is illustrated and described herein as embodied in a method for determining the transit time of electrical signals on printed circuit boards using automatic standard test equipment, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
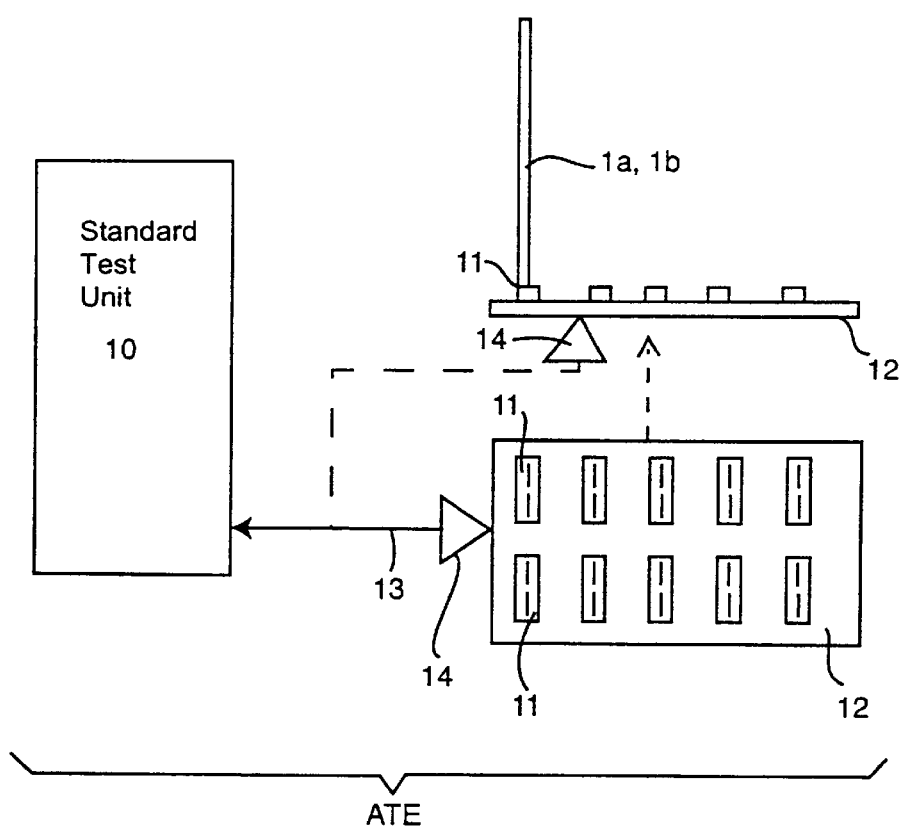
FIG. 1 is block diagram of automatic standard test equipment in two successive steps of a method according to the invention.

Referring now to the figures of the drawing in detail and first, particularly, to FIG. 1 thereof, there is shown a piece of automatic test equipment (ATE). The automatic test equipment has a standard test unit 10 and a performance board 12 that is connected thereto via a bus system 13 and a CIF connector 14. The performance board has rows 11 of fittings for receiving PCBs. Whereas in the performance board 12 shown in a plan view in the lower part of FIG. 1, a printed circuit board to be measured has not yet been plugged in to the row 11 of fittings. A printed circuit board 1a, 1b has been plugged into the row 11 of fittings of the performance board 12 shown in a side view in the upper part of FIG. 1.

The standard test equipment 10 of the ATE can be, for example, a test unit T5581H (type designation of Advantest).

In order to carry out a first step of the method according to the invention, transit times $t_{PB}$ are determined, using time domain reflection (TDR) measurement, on the performance board 12 between the CIF connector 14 of a non-illustrated test head and the fitting 11. The TDR signal transit time measurement is carried out in the known standard test equipment T5581H used by way of example by calling the standardization routine PBDATA.

According to a second method step, a standardized printed circuit board 1a, 1b is then plugged into the predetermined fitting 11 of the performance board 12. This can be, for example, a standard printed circuit board. According to a third step of the method according to the invention, a sum transit time $t_{PB}+t_{PCB}$ is then measured between the CIF connector 14 and a respective landing pad 4, for example a SDRAM module which is to be mounted later on the printed circuit board 1a, 1b.

According to a fourth method step, a difference $\Delta t=t_{PB}+t_{PCB}-t_{PB}$ is then determined, as a result of which the influence of the transit time of the printed circuit board 1a, 1b becomes apparent.

The transit time measurement according to the invention is carried out either for all the channels, that is to say all the signal pins of the printed circuit board 1a, 1b or for channels which are relevant to the signal transit time.

Figure 2A:
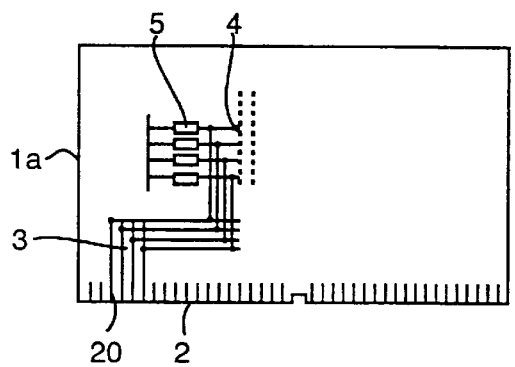
FIGS. 2A and 2B are diagrammatic, plan view of two different types of printed circuit boards to be measured.
Figure 2B:
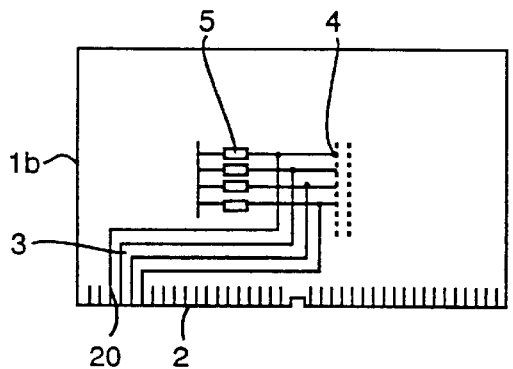

FIGS. 2A and 2B are schematic views of two different types of printed circuit boards 1a and 1b which are present without active components, for example SDRAMs, PLL or registers, but are equipped with passive components 5 such as capacitors and resistors. Channels 20 or parts thereof of a section 3 of a line (illustrated schematically by way of example) lead from pins 2 of the printed circuit boards 1a and 1b to the landing pads 4 of a non-illustrated semiconductor module. A comparison of the two printed circuit board types 1a and 1b illustrated schematically in FIGS. 2A and 2B shows that the anticipated values of the signal transit times to be determined with the method according to the invention differ in the two printed circuit board types. According to FIGS. 2A and 2B, the length of the line of the section of line 3 of the printed-circuit board 1b illustrated in FIG. 2B is longer than in the printed circuit board 1a illustrated in FIG. 2A.

Figure 3:
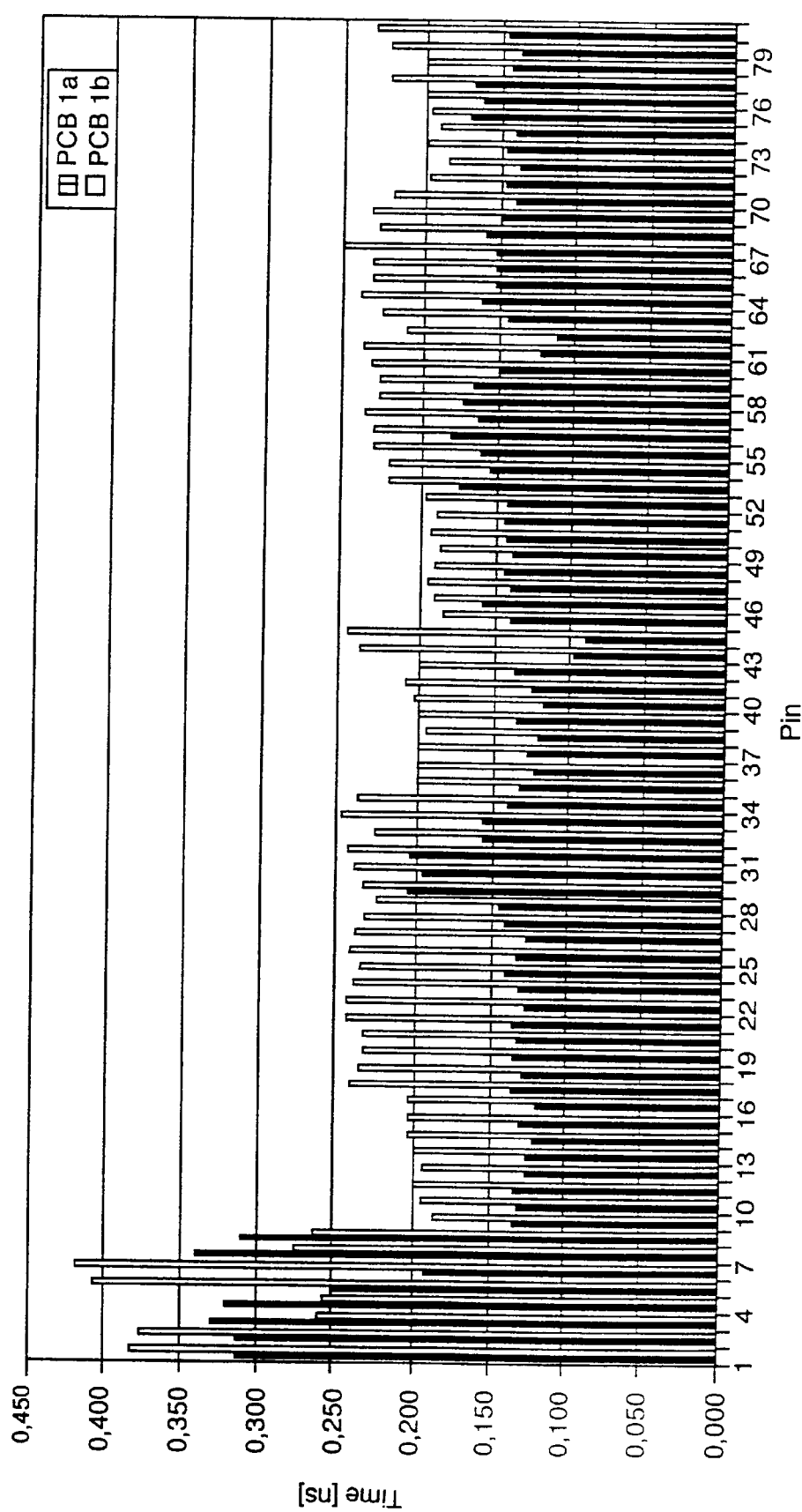
FIG. 3 is a graph showing measurement results of transit time measurements for the two different types of printed circuit boards.

FIG. 3 shows the difference $\Delta t$, formed in accordance with the fourth step of the method according to the invention, between the signal transit time $t_{PB}$ (the first measuring step) on the performance board 12, that is to say between the CIF connector 14 and the fitting 11, and the sum of the transit times $t_{PB}+t_{PCB}$, measured according to the third step of the method according to the invention, between the CIF connector 14 and the landing pad 4 of the printed circuit board 1a and 1b. In FIG. 3, the hatched bars plotted in the ordinate direction represent the transit time values of pins 1 to 80 of the printed circuit board (PCB) 1a according to FIG. 2A, while the measured values represented by the non-hatched bars represent the transit time values of the respective pins of the printed circuit board 1b according to FIG. 2B.

The transit time values determined with the method according to the invention make it possible to separate the component performance, for example the SDRAM component performance, quickly and unambiguously from the influence of the transit time of the lines on the printed circuit board. As a result, the test parameters can be optimized and the precision of the tests increased. By using productively employed automatic standard test equipment it is possible to eliminate all the fault sources that occur during a transfer from an additional piece of test equipment. The transit time measured values determined with the method according to the invention, as illustrated graphically for example in FIG. 3, provide more precise knowledge of the actual transit time conditions of the printed circuit boards in contrast to the simulated behaviour. The measured values plotted in FIG. 3 make it apparent that with the method according to the invention it is possible to detect differences in transit times of the printed circuit boards in the sub-nanosecond range. The time parameters that can be determined with the method according to the invention thus approximate to the time precision provided by the automatic standard test equipment.

We claim:

1. A method for determining transit times of electrical signals on printed circuit boards using a time domain reflection measurement technique, which comprises the steps of:

measuring a first signal transit time of a first signal travelling from a starting point to a fitting of a specific plug-in slot on a standard performance board of an automatic test equipment unit, the standard performance board configured without a printed circuit board being plugged in the fitting;

inserting the printed circuit board into the fitting of the plug-in slot of the standard performance board;

measuring a second signal transit time of a second signal travelling from the starting point to an end point along at least one channel on the printed circuit board plugged in;

deriving a difference between the first signal transit time and the second signal transit time; and determining from the difference a channel signal transit time of the channel on the printed circuit board.

2. The method according to claim 1, which comprises carrying out the step of measuring the second signal transit time without active components disposed on the printed circuit board, the printed circuit board only having passive components.

3. The method according to claim 1, which comprises determining the channel signal transit time for all channels of the printed circuit board.

4. The method according to claim 1, which comprises measuring the channel signal transit time on the printed circuit board configured for carrying synchronous dynamic random access memory chips.

5. The method according to claim 1, which comprises forming the printed circuit board as to receive memory chips.

* * * * *